US012325910B2

(12) United States Patent
Chen et al.

(10) Patent No.: US 12,325,910 B2
(45) Date of Patent: Jun. 10, 2025

(54) DEPOSITION OF CONFORMAL AND GAP-FILL AMORPHOUS SILICON THIN-FILMS

(71) Applicant: Applied Materials, Inc., Santa Clara, CA (US)

(72) Inventors: Yihong Chen, San Jose, CA (US); Rui Cheng, Santa Clara, CA (US); Pramit Manna, Sunnyvale, CA (US); Kelvin Chan, San Ramon, CA (US); Karthik Janakiraman, San Jose, CA (US); Abhijit Basu Mallick, Palo Alto, CA (US); Srinivas Gandikota, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 37 days.

(21) Appl. No.: 15/297,257

(22) Filed: Oct. 19, 2016

(65) Prior Publication Data
US 2017/0114453 A1 Apr. 27, 2017

Related U.S. Application Data

(60) Provisional application No. 62/244,834, filed on Oct. 22, 2015.

(51) Int. Cl.
*H01L 21/02* (2006.01)
*C23C 16/04* (2006.01)
(Continued)

(52) U.S. Cl.
CPC .............. *C23C 16/24* (2013.01); *C23C 16/04* (2013.01); *C23C 16/045* (2013.01);
(Continued)

(58) Field of Classification Search
CPC .. C23C 16/24; C23C 16/455; H01L 21/02664
See application file for complete search history.

(56) References Cited

U.S. PATENT DOCUMENTS 5,714,415 A 2/1998 Oguro
5,773,357 A 6/1998 Shishiguchi
(Continued)

FOREIGN PATENT DOCUMENTS

CN 101111931 A 1/2008
JP H07221026 A 8/1995
(Continued)

OTHER PUBLICATIONS

"Chemical_Vapor_Deposition", Wikipedia, No date.*
(Continued)

*Primary Examiner* — Thomas T Pham
(74) *Attorney, Agent, or Firm* — Servilla Whitney LLC

(57) ABSTRACT

Methods for depositing film comprising cyclical exposure of a substrate surface to a precursor and a degas environment to remove gas evolved from the film. Some embodiments further comprise the incorporation poisoning the top of a feature to inhibit film growth at the top of the feature. Some embodiments further comprising etching a portion of the film deposited at the top of a feature between cycles to increase gap-fill uniformity.

16 Claims, 6 Drawing Sheets

(51) Int. Cl.
*C23C 16/24* (2006.01)
*C23C 16/455* (2006.01)
*C23C 16/458* (2006.01)

(52) U.S. Cl.
CPC ...... *C23C 16/455* (2013.01); *C23C 16/45523* (2013.01); *C23C 16/4584* (2013.01)

(56) References Cited

U.S. PATENT DOCUMENTS

| | | | | |
|---|---|---|---|---|
| 6,142,163 | A * | 11/2000 | McMillin | G05D 16/2013 137/487.5 |
| 6,162,716 | A * | 12/2000 | Yu | H01L 21/28035 257/E21.197 |
| 6,852,635 | B2 | 2/2005 | Satta et al. | |
| 2003/0155074 | A1 | 8/2003 | Yao | |
| 2004/0033674 | A1 * | 2/2004 | Todd | C30B 25/02 438/478 |
| 2007/0117359 | A1 | 5/2007 | Todd | |
| 2008/0124925 | A1 | 5/2008 | Madan et al. | |
| 2008/0138985 | A1 | 6/2008 | Madan et al. | |
| 2008/0254619 | A1 | 10/2008 | Lin et al. | |
| 2009/0035941 | A1 | 2/2009 | Park et al. | |
| 2009/0278224 | A1 * | 11/2009 | Kim | H01L 21/02532 257/506 |
| 2011/0097902 | A1 | 4/2011 | Singh et al. | |
| 2011/0155057 | A1 * | 6/2011 | Kato | C23C 16/45519 118/719 |
| 2013/0078784 | A1 * | 3/2013 | Minamihaba | C09K 3/1463 438/430 |
| 2013/0196078 | A1 | 8/2013 | Yudovsky et al. | |
| 2014/0068962 | A1 | 3/2014 | Mori et al. | |
| 2014/0273529 | A1 | 9/2014 | Nguyen et al. | |
| 2014/0335680 | A1 | 11/2014 | Wang et al. | |
| 2014/0349478 | A1 | 11/2014 | Koschinsky et al. | |
| 2015/0155368 | A1 * | 6/2015 | Ahmed | H01L 29/66765 438/158 |
| 2015/0179436 | A1 * | 6/2015 | Greer | H01L 39/2493 438/764 |
| 2015/0187643 | A1 * | 7/2015 | Kakimoto | H01L 21/67109 118/704 |
| 2015/0345015 | A1 * | 12/2015 | Chiba | C23C 16/4412 118/730 |

FOREIGN PATENT DOCUMENTS

| | | |
|---|---|---|
| JP | 108213327 A | 8/1996 |
| JP | H08203847 A | 8/1996 |
| JP | 2008527738 A | 7/2008 |
| KR | 20090013286 A | 2/2009 |
| TW | 201513173 A | 4/2015 |
| WO | 2006078354 A2 | 7/2006 |
| WO | 2015103358 A1 | 7/2015 |

OTHER PUBLICATIONS

PCT International Search Report and Written Opinion in PCT/US2016/057665 dated Jan. 20, 2017, 12 pages.
PCT International Preliminary Reporton Patentability in PCT/US2016/057665 dated May 3, 2018, 9 pages.
Machine Translation of JPH07221026, 17 pages.

* cited by examiner

DEPOSITION OF CONFORMAL AND GAP-FILL AMORPHOUS SILICON THIN-FILMS

CROSS-REFERENCE TO RELATED APPLICATIONS

This application claims priority to U.S. Provisional Application No. 62/244,834, filed Oct. 22, 2015, the entire disclosure of which is hereby incorporated by reference herein.

TECHNICAL FIELD

The present disclosure relates generally to methods of depositing thin films. In particular, the disclosure relates to processes for the deposition of films comprising amorphous silicon.

BACKGROUND

Amorphous silicon is widely used in semiconductor devices, flat-panel displays, and solar cells. There remains a key technical challenge for the development of amorphous silicon deposition process with conformality (i.e., good step coverage) or gap-fill performance in high aspect-ratio features. Conventional LPCVD process is limited to high temperature (>550° C.) and low pressure, and, therefore, exhibits poor step coverage and/or gap-fill performance; PECVD process also does not give good step coverage and/or gap-full performance.

A conventional CVD process for amorphous silicon occurs in a continuous manner. When the deposition rate is high, the hydrogen gas that is produced from film-forming reactions aggregates and becomes entrapped in the film. This entrapment leads to bubble formation in the film. To mitigate this issue, LPCVD processes usually occur at high temperature to ensure low H content in as-deposited films and at low deposition rate by lowering the precursor partial pressure so this entrapment does not occur.

There is a need in the art for methods of depositing amorphous silicon films with good conformality and throughput.

SUMMARY

One or more embodiments of the disclosure are directed to processing methods comprising exposing a substrate surface to a silicon precursor to form an amorphous silicon film having an outgassable species comprising hydrogen. The amorphous silicon film is exposed to an inert degas environment to remove the outgassable species from the amorphous silicon film to form a degassed amorphous silicon film.

Additional embodiments of the disclosure are directed to processing methods comprising positioning a substrate surface in a processing chamber. The substrate surface has at least one feature thereon. The at least one feature creates a gap with a bottom, top and sidewalls. The substrate surface is exposed to a silicon precursor to form an amorphous film having an outgassable species comprising hydrogen on the at least one feature. The substrate surface is exposed to an inert degas environment to remove outgassable species from the amorphous film to form a degassed amorphous film. Exposure to the precursor and the inert degas environment is repeated to grow the degassed amorphous film to a predetermined thickness.

Further embodiments of the disclosure are directed to processing methods comprising placing a substrate having a substrate surface into a processing chamber comprising a plurality of sections. Each section of the processing chamber is separated from adjacent sections by a gas curtain. At least a portion of the substrate surface is exposed to a first process condition in a first section of the processing chamber. The first process condition comprises disilane to deposit an amorphous silicon film having an outgassable species comprising hydrogen on the substrate surface. The substrate surface is laterally moved through a gas curtain to a second section of the processing chamber. The substrate surface is exposed to a second process condition in the second section of the processing chamber. The second process condition degassing the amorphous silicon film to remove the outgassable species to form a degassed amorphous silicon film. The substrate surface is laterally moved through a gas curtain to a third section of the processing chamber. Exposure to the first section and second section including lateral movement of the substrate surface is repeated to form a degassed amorphous silicon film of a predetermined thickness.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
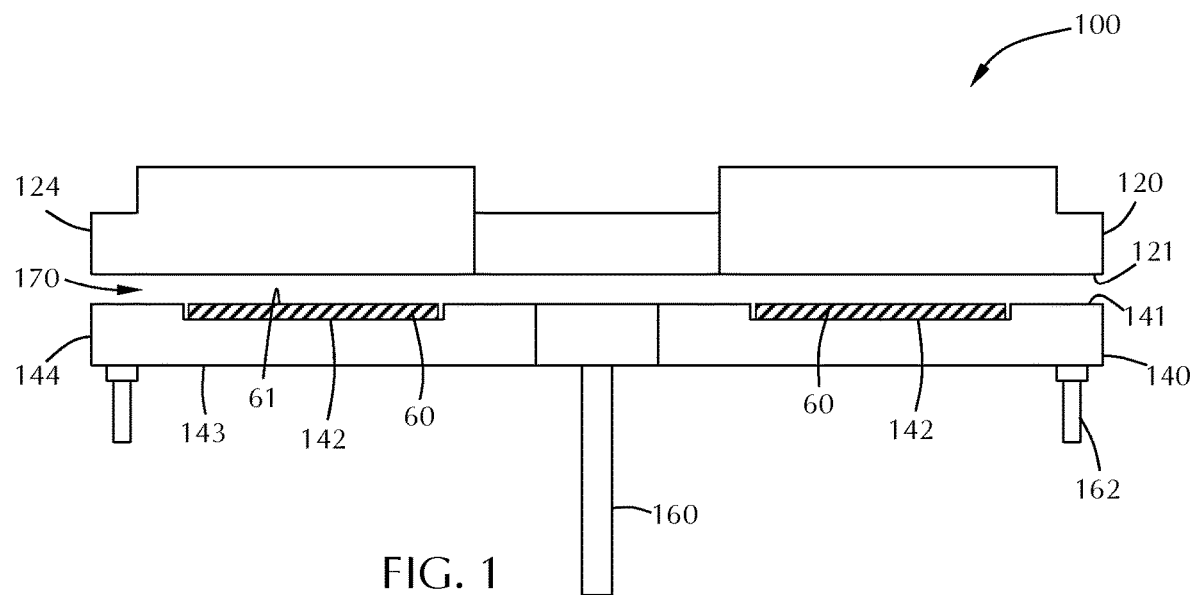
FIG. 1 shows a cross-sectional view of a batch processing chamber in accordance with one or more embodiment of the disclosure.

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Embodiments of the disclosure are directed to the deposition of amorphous silicon films using a pulsed deposition mode. A pulsed deposition mode exposes the precursor for a few seconds to allow film deposition. The substrate is then moved to an inert environment allowing the film to fully degas. After degassing, the substrate is moved back to a precursor environment for the next exposure. Because the film deposited is very thin in each exposure, $H_2$ can be released without forming bubbles. Under this pulsed process mode, a film can be deposited at a wide range of temperatures and pressures without bubble formation. One or more embodiments of the disclosed process can be performed at lower temperature than typical amorphous silicon deposition. Some embodiments produce films with high conformality (>90%). The method of various embodiments allow for the formation of continuous and/or defect/bubble-free films.

The through-put can be affected because the purge-pump after every exposure will include a lot of overhead time. To mitigate the effect on through-put, a special CVD process has been developed. Some embodiments of the disclosure are directed to the use of a spatial CVD process in which a film is deposited under a precursor pulse mode. The spatial CVD process and hardware do not have a significant effect on the overall process through-put. A first portion of a substrate processing chamber flows a silicon-precursor (e.g., disilane, trisilane, tetrasilane, isotetrasilane, neopentasilane, cyclopentasilane, cyclohexasilane or, in general, $Si_xH_y$ with x=2 or more). A second portion of the processing chamber flows either an inert gas (e.g., Ar, He, $N_2$) or other reactive gas that could modulate the deposition process (e.g., $H_2$).

In a conventional CVD chamber, when deposition starts, precursor pressure is initially at zero and ramps to the target pressure. The film deposited during the ramp portion does not bear properties of films deposited at the target pressure. The spatial CVD process of various embodiments can move the substrate into a processing chamber (or region of a processing chamber) that is pre-stabilized at the target pressure, avoiding the ramp portion of the process.

While the process of various embodiments is described with respect to the deposition of amorphous silicon, those skilled in the art will understand that the scope of the disclosure is no so limited. Embodiments of the disclosure can be used in the formation of other materials such as, but not limited to, Ge, W, Al, Co and Cu depositions.

In some embodiments, step coverage and gap-fill properties are improved using surface poisoning. The top of the trench/pillar (also referred to as a surface feature) is selectively altered by surface poisoning. Methods of surface poisoning include, but are not limited to, remote/direct plasma treatment and chemical modification such as surface silylation/hydrosilylation. Surface poisoning can lower the deposition rate or extend incubation delay on the top of the feature and achieve more deposition in the trench than the top of the feature. This surface poisoning-deposition sequence can be repeated multiple times until the trench is filled.

In some embodiments, step coverage and gap-fill properties are improved using a deposition-etch process. After conformal deposition of amorphous silicon on a feature, material is selectively removed from the feature top by tuning the etch process. This may allow more material to be deposited in the trench than on the feature top. This deposition-etch sequence can be repeated multiple times until the trench is filled.

One or more embodiments of the disclosure are directed to processing methods comprising sequentially exposing a substrate surface to a precursor (e.g., a silicon precursor) to form an amorphous film (e.g., an amorphous silicon film) having an outgassable species and a degas environment to remove the outgassable species from the amorphous film. While embodiments are described with respect to the deposition of amorphous silicon, it will be understood by those skilled in the art that other materials—especially those that experience bubbling from degassed species—can be deposited.

In some embodiments, conformal amorphous silicon (a-Si) deposition can be achieved by maximizing the partial pressure of the silicon precursor while minimizing the wafer temperature. Suitable silicon precursors include, but are not limited to, poly-silanes ($Si_xH_y$). For example, poly-silanes include disilane ($Si_2H_6$), trisilane ($Si_3H_8$), tetrasilane ($Si_4H_{10}$), isotetrasilane, neopentasilane ($Si_5H_{12}$), cyclopentasilane ($Si_5H_{10}$), hexasilane ($C_6H_{14}$), cyclohexasilane ($Si_6H_{12}$) or, in general, $Si_xH_y$ with x=2 or more, and combinations thereof. For example, disilane, which has a moderate processing temperature and high vapor pressure, may be used as the silicon precursor, alone or in combination with other species.

In some embodiments, the silicon precursor comprises substantially only disilane. As used in this specification and the appended claims, the phrase "substantially only disilane" means that at least 95% of the active species is disilane. Other gases, such as carrier gases and inert gases, can be included in any amount.

The deposited film includes an outgassable species that may evolve or outgas from the film, for example, hydrogen. The inert degas environment provides an opportunity for the gaseous species to evolve, minimizing bubbling of the final film. The inert degas environment can include any condition which allows or encourages removal of the outgassable species of the film. For example, the degas environment may consists essentially of an inert gas. As used in this regard, "consists essentially of" means that there is no gaseous species that interfere with the outgassing of the deposited film. Other reactive species may be present without inhibiting degassing of the film while still consisting essentially of an inert gas. In some embodiments, the inert degas environment is an environment where there is substantially no chemical reactions occurring on the deposited film. For example, there may be substantially no chemical species that may be reactive with the deposited film. In some embodiments, the degas environment does not use UV light, plasma or microwave radiation to cause degassing of the outgassable species.

In one or more embodiments, the amorphous silicon film is deposited by a chemical vapor deposition process. Although similar processing chambers can be used, Chemical Vapor Deposition (CVD) processes are different from Atomic Layer Deposition (ALD). An ALD process is a self-limiting process where a single layer of material is deposited using a binary (or higher order) reaction. The process continues until all available active sites on the substrate surface have been reacted. A CVD process is not self-limiting, and a film can be grown to any predetermined thickness.

Suitable inert gases include, but are not limited to, one or more of argon, helium, nitrogen, and/or mixtures thereof. In some embodiments, the inert degas environment comprises substantially no oxygen. As used in this regard, "substantially no oxygen" means that the inert degas environment has less than about 1% (on an atomic basis) oxygen atoms in the ambient conditions adjacent the substrate surface.

In one or more embodiments, the outgassable species comprises hydrogen. As used in this regard, an outgassable species comprising hydrogen can include one or more of hydrogen, $SiH_2$, $SiH_3$, $SiH_4$, and/or other low-order silanes.

The pressure in the processing chamber, or region of the processing chamber can be independently controlled for the precursor exposure and degas environment. In some embodiments, exposure to each of the silicon precursor and the degas environment occurs at a pressure in the range of about 50 mTorr to about 200 Torr. In some embodiments, the silicon precursor is exposed to the substrate at a pressure greater than or equal to about 500 mTorr, or greater than or equal to about 1 Torr, or greater than or equal to about 5 Torr, or greater than or equal to about 10 Torr, or greater than or equal to about 20 Torr, or greater than or equal to about 30 Torr.

The temperature at which the substrate surface is exposed to the precursor or degas environment can be varied depending on, for example, the thermal budget of the device being formed and the precursor. In some embodiments, exposure to each of the precursor and the degas environment occurs at a temperature in the range of about 350° C. to about 700° C. In one or more embodiments, the silicon halide precursor is exposed to the substrate at a temperature in the range of about 375° C. to about 600° C., or in the range of about 400° C. to about 550° C.

In some embodiments, disilane-based conformal a-Si processes has are deposited with a wafer temperature less than about 450° C., and disilane partial pressure is greater than or equal to about 20 Torr. In an exemplary embodiment, the substrate is exposed to the silicon precursor at a pressure greater than or equal to about 20 Torr at a temperature in the range of about 400° C. to about 550° C.

Some embodiments of the disclosure are directed to amorphous silicon film deposition using a batch processing chamber, also referred to as a spatial processing chamber. FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer peripheral edge 124 which in the embodiments shown, is substantially round.

The specific type of gas distribution assembly 120 used can vary depending on the particular process being used. Embodiments of the invention can be used with any type of processing system where the gap between the susceptor and the gas distribution assembly is controlled. While various types of gas distribution assemblies can be employed (e.g., showerheads), embodiments of the invention may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s). A substrate moving from one end of the gas distribution assembly to the other end will be exposed to each of the process gases in turn, forming a layer on the substrate surface.

Figure 2:
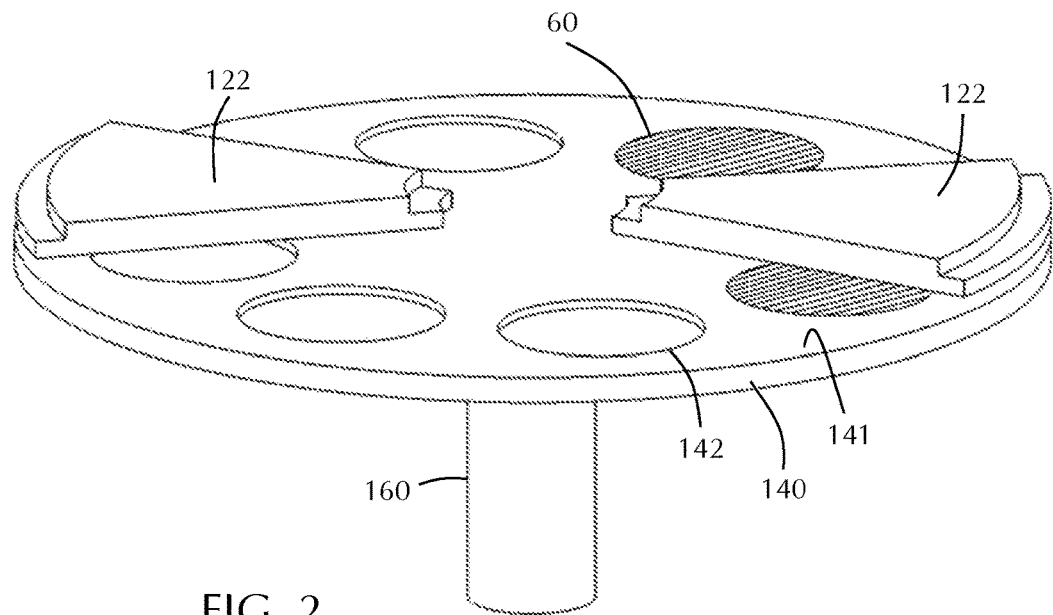
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the invention described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
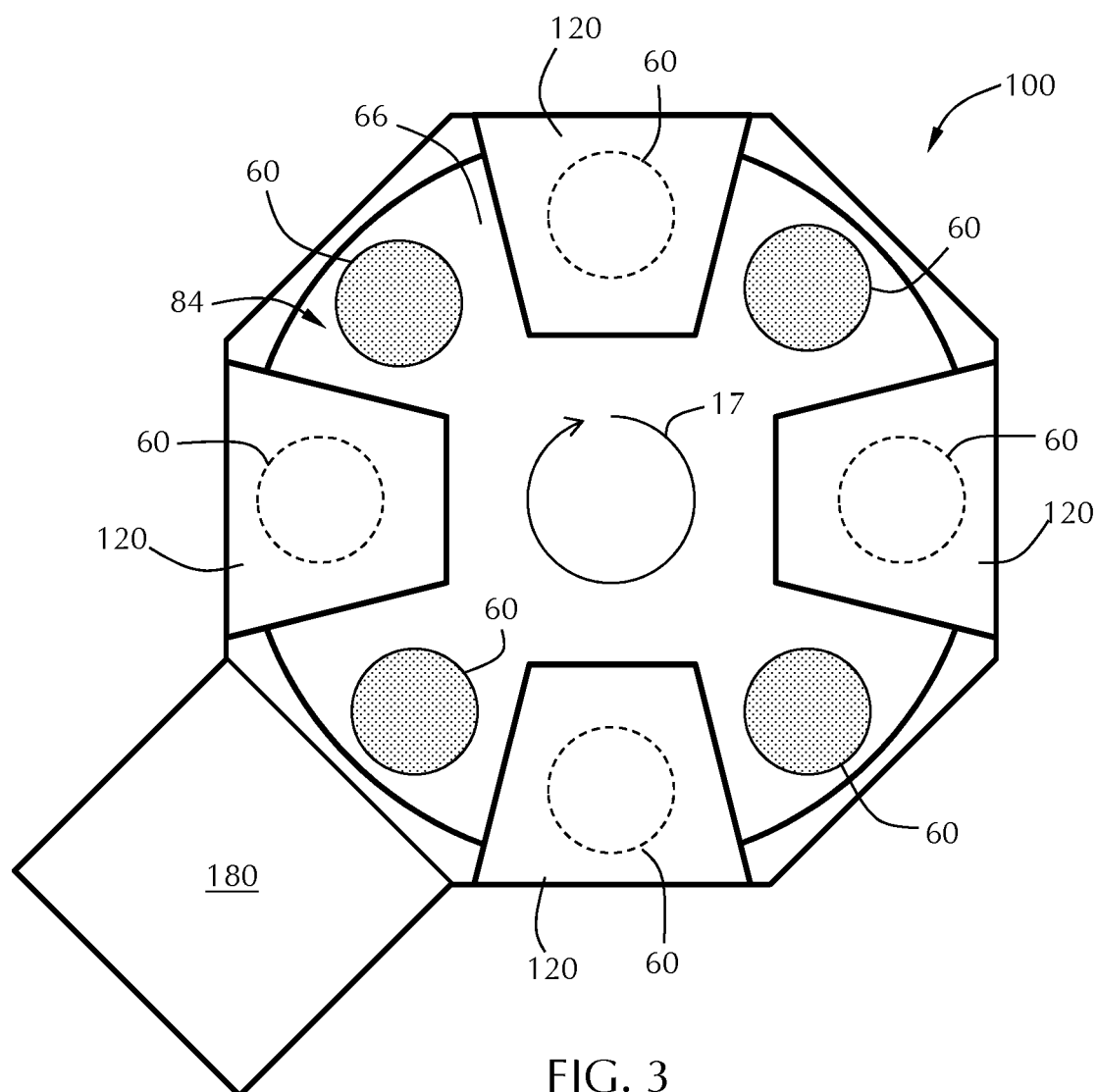
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 120. Rotating 17 the susceptor assembly 140 by 45° will result in each substrate 60 which is between injector assemblies 120 to be moved to an injector assembly 120 for film deposition, as illustrated by the dotted circle under the injector assemblies 120. An additional 45° rotation would move the substrates 60 away from the injector assemblies 120. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one. In an exemplary embodiment, the gas distribution assembly 120 includes eight processing regions separated by gas curtains and the susceptor assembly 140 can hold six wafers.

The processing chamber 100 shown in FIG. 3 is merely representative of one possible configuration and should not be taken as limiting the scope of the invention. Here, the processing chamber 100 includes a plurality of gas distribution assemblies 120. In the embodiment shown, there are four gas distribution assemblies (also called injector assemblies 120) evenly spaced about the processing chamber 100. The processing chamber 100 shown is octagonal; however, those skilled in the art will understand that this is one possible shape and should not be taken as limiting the scope of the invention. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
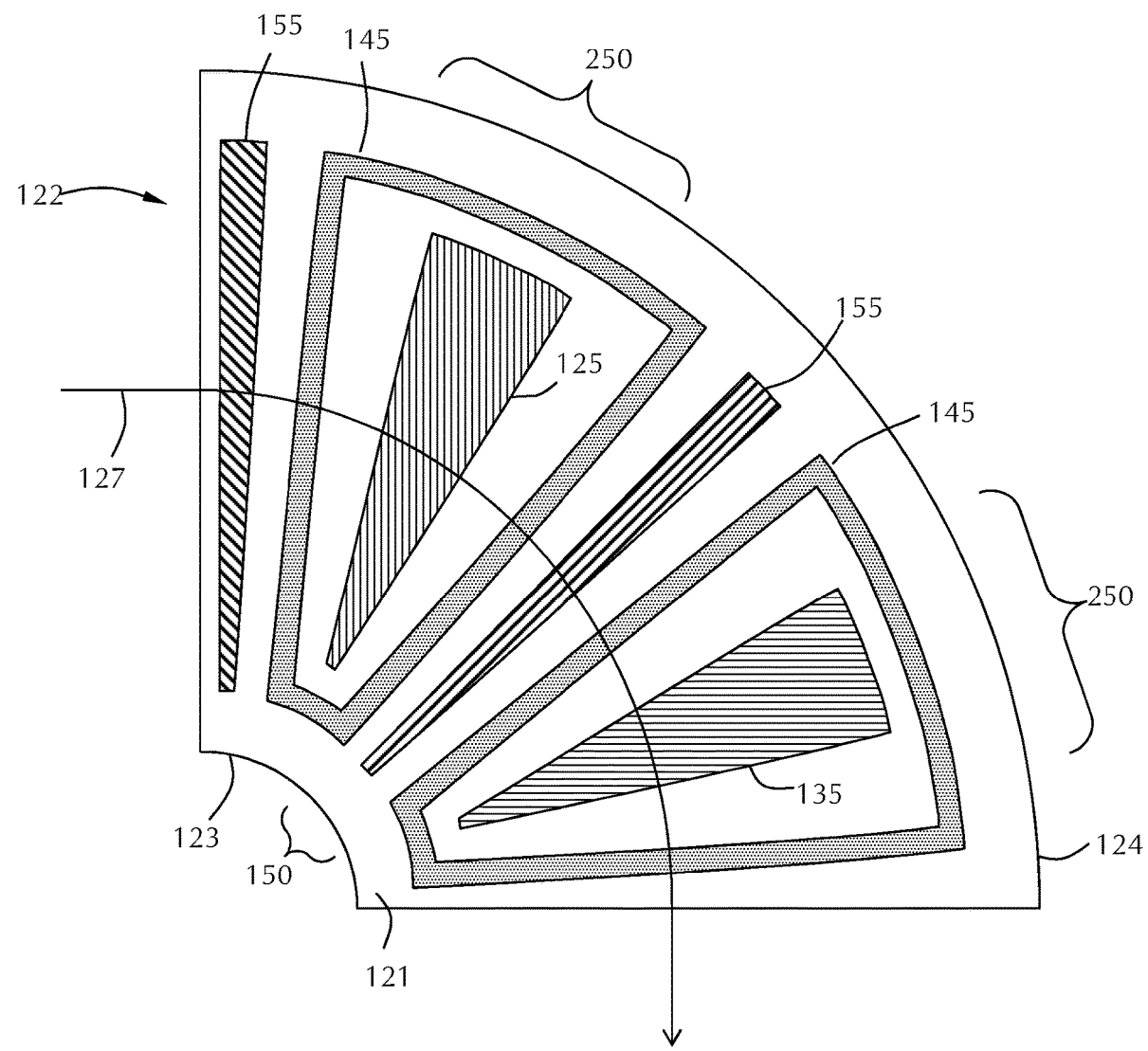
FIG. 4 shows a schematic view of a portion of a wedge shaped gas distribution assembly for use in a batch processing chamber in accordance with one or more embodiment of the disclosure.
Figure 5:
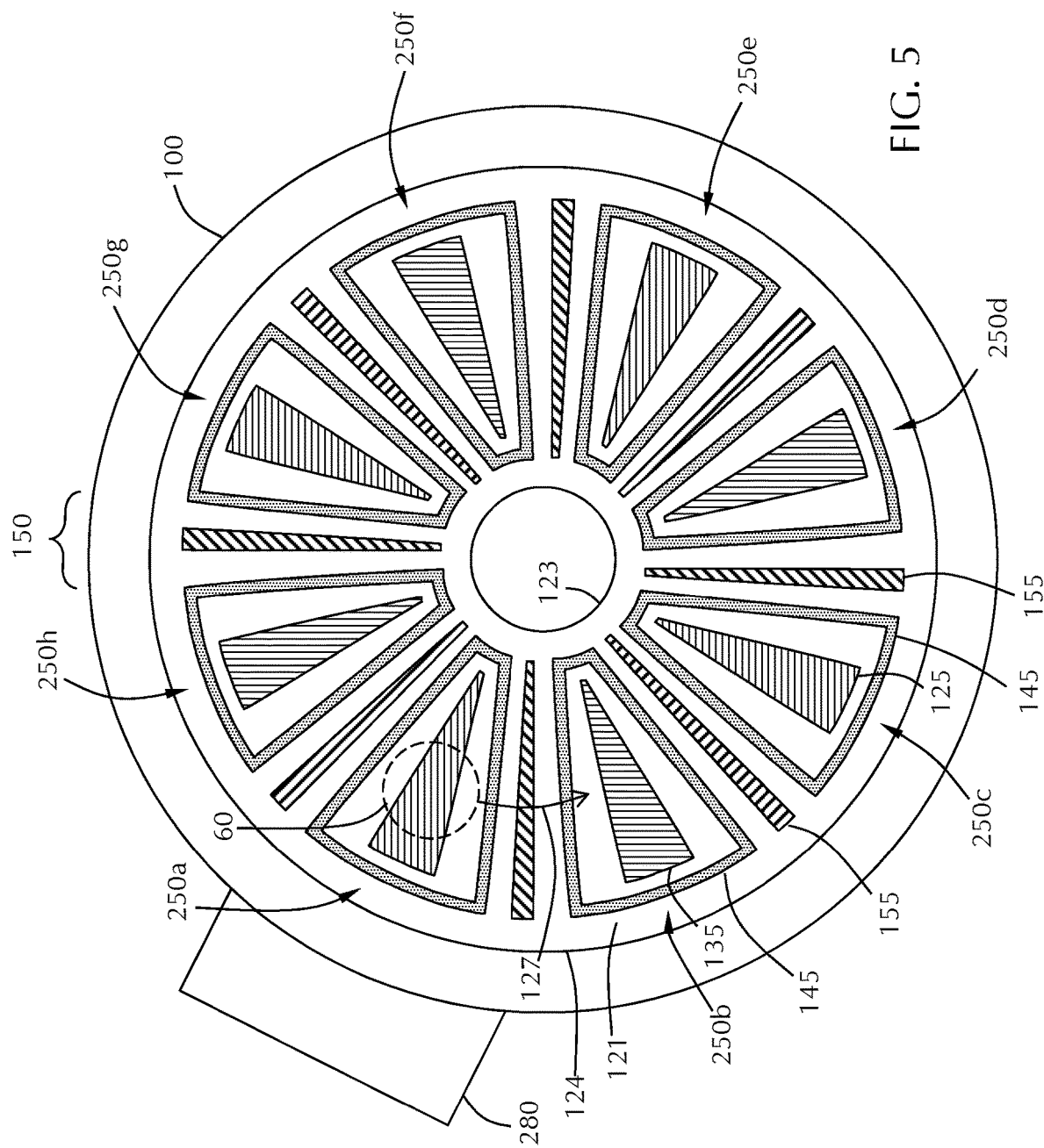
FIG. 5 shows a schematic view of a batch processing chamber in accordance with one or more embodiment of the disclosure.

FIG. 4 shows a sector or portion of a gas distribution assembly 120, which may be referred to as an injector unit 122. The injector units 122 can be used individually or in combination with other injector units. For example, as shown in FIG. 5, four of the injector units 122 of FIG. 4 are combined to form a single gas distribution assembly 120. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 120 in accordance with one or more embodiment may comprise a plurality of sectors (or injector units 122) with each sector being identical or different. The gas distribution assembly 120 is positioned within the processing chamber and comprises a plurality of elongate gas ports 125, 135, 145, 155 in a front surface 121 of the gas distribution assembly 120. The plurality of elongate gas ports 125, 135, 145, 155 extend from an area adjacent the inner peripheral edge 123 toward an area adjacent the outer peripheral edge 124 of the gas distribution assembly 120. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first reactive gas port 125 and the second reactive gas port 135 to form a layer. The injector unit 122 shown makes a quarter circle but could be larger or smaller. The gas distribution assembly 120 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 120 form a separation into a plurality of processing regions 250. The processing regions are roughly defined around the individual gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 120 to provide a frame of reference. The substrate 60 may often sit on a susceptor assembly to be held near the front surface 121 of the gas distribution assembly 120. The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150*a*, 150*b*. Rotating the substrate 60 along path 127 will move the substrate counter-clockwise around the processing chamber 100. Thus, the substrate 60 will be exposed to the first processing region 250*a* through the eighth processing region 250*h*, including all processing regions between.

Embodiments of the invention are directed to processing methods comprising a processing chamber 100 with a plurality of processing regions 250*a*-250*h* with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250*a*-250*h*. The number of gas curtains is generally equal to or greater than the number of processing regions.

A plurality of substrates 60 are positioned on a substrate support, for example, the susceptor assembly 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example if the first reactive gas is flowing into processing regions 250*b* through processing region 250*h*, an inert gas would be flowing into process region 250*a*. The inert gas can be flowed through the first reactive gas port 125 or the second gas port 135.

The inert gas flow within the processing regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the processing regions easier by decreasing the differences in pressure between adjacent regions.

Accordingly, one or more embodiments of the disclosure are directed to processing methods utilizing a batch processing chamber like that shown in FIG. 5. A substrate 60 is placed into the processing chamber which has a plurality of regions 250, each section separated from adjacent section by a gas curtain 150. At least a portion of the substrate surface is exposed to a first process condition in a first region 250*a* of the processing chamber. The first process condition of some embodiments comprises a silicon precursor to form an amorphous silicon layer.

The substrate surface is laterally moved through a gas curtain 150 to a second region 250*b*. The amorphous silicon layer is exposed to a second process condition in the second region 250*b*. The second process condition of some embodiments comprises an environment that allows degassing of the amorphous film formed in the first region 250*a*.

The substrate surface is laterally moved with the degassed amorphous silicon film through a gas curtain 150 to a third region 250*c* of the processing chamber. The substrate surface can then be repeatedly exposed to additional first process conditions and second process conditions to form a film with a predetermined film thickness. For example, a degassed amorphous silicon film can be formed.

In some embodiments, the substrate surface is repeatedly exposed to the precursor in one section of the processing chamber and a degassing environment in the next section of the processing chamber. In an embodiment of this sort, the first process region 250*a*, third process region 250*c*, fifth process region 250*e* and seventh process region 250*g* may have a precursor gas flowing while the second process region 250*b*, fourth process region 250*d*, sixth process region 250*f* and eighth process region 250*h* have a degassing environment. Those skilled in the art will understand that the use of ordinals such as "first" and "second" to describe processing regions do not imply a specific location within the processing chamber, or order of exposure within the processing chamber. For example, the substrate may be exposed to the degassing environment first followed by the precursor in a second section. Referring to FIG. 5, in an embodiment, first region 250a is a loading/unloading section adjacent a factory interface 280 (e.g. load lock). The first region 250a may be the degassing environment with alternating sections having the precursor. The substrate being processed would be exposed to the degassing environment upon loading and unloading.

The thickness of the film formed with the precursor before exposure to the degas environment can be modified. In some embodiments, each exposure to the precursor (e.g., the silicon precursor) and the degas environment grows a film with a thickness in the range of about 5 Å to about 20 Å.

The precursor and degas environments can be repeatedly sequentially exposed to the substrate surface to form a film with a predetermined thickness. In some embodiments, the amorphous silicon film has a total thickness in the range of about 100 Å to about 1 μm.

Figure 6A:
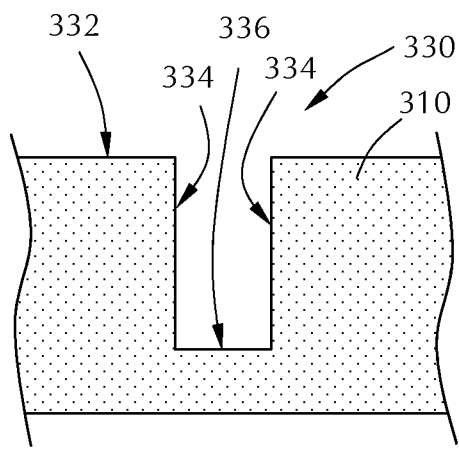
FIGS. 6A through 6C show a gap-fill process in accordance with one or more embodiment of the disclosure.

In some embodiments, the substrate surface has at least one feature thereon. The feature can be, for example, a trench or pillar. As used in this regard, the term "feature" means any intention surface irregularity. Suitable examples of features include, but are not limited to, trenches which have a top, two sidewalls and a bottom, peaks which have a top and two sidewalls. Referring to FIG. 6A, a feature 330 is shown as a trench in the substrate 310. The feature has a top 332, bottom 336 and sidewalls 334. A gap is created between the sidewalls 334. A film deposited on the feature will cover the top 332, bottom 336 and sidewalls 334 of the trench. The uniformity of the film coverage is referred to as the conformality. Conformality is measured as the thickness of the film at the bottom of the feature relative to the top of the feature. A conformality of 100% means that the thickness at the top 332 of the feature and the bottom 336 of the feature are the same. In some embodiments, the substrate surface comprises at least one feature having a top and sidewall and the amorphous silicon film has a conformality of greater than or equal to about 75%, or greater than or equal to about 80%, or greater than or equal to about 85%, or greater than or equal to about 90%, or greater than or equal to about 95%.

The process can include additional process steps to, for example, treat, etch or poison the film deposited with the precursor. In one or more embodiments, the substrate surface is exposed to a reactant between exposure to the precursor and the degas environment. The reactant can be any gas that can modify a property of the amorphous film. In some embodiments, the reactant densifies the film. In some embodiments, the reactant poisons the top portion of the film to inhibit additional film growth. In some embodiments, the reactant etches some of the film.

Figure 6B:
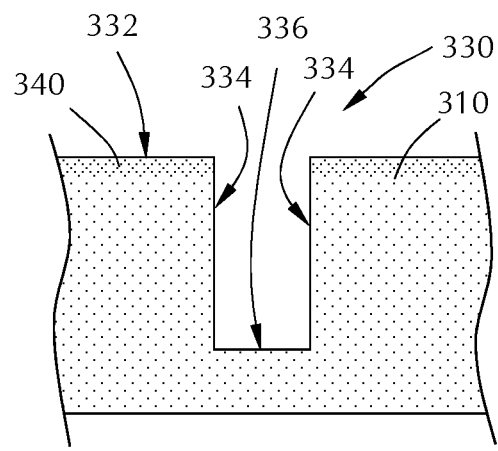
Figure 6C:
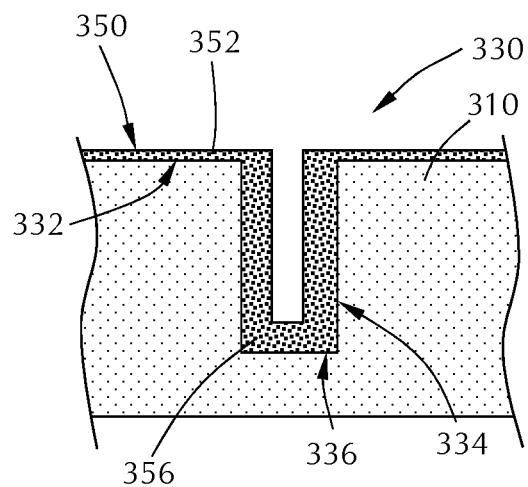

Referring to FIGS. 6A through 6C, one or more embodiments include poisoning of the top 332 of the feature 330 to inhibit growth of the deposited film. In FIG. 6A, a substrate with at least one feature 330 is positioned in the processing chamber. The substrate 310 is exposed to a reactant to poison the top surface 332 to create a poisoned portion 340, as shown in FIG. 6B. A film 350 is deposited on the substrate 310 and the feature 330. The thickness of the film 350 at the top 352 is less than the thickness of the film 350 at the bottom 356 so that the conformality is greater than 100%. The process can be repeated to fill the gap of the feature.

The reactant used to poison the surface can be any suitable reactant that can reversibly affect the material. In some embodiments, the reactant comprises a chlorine-containing species. In some embodiments, the chlorine-containing species is a hexachlorodisilane or a chlorine-containing plasma.

Figure 7A:
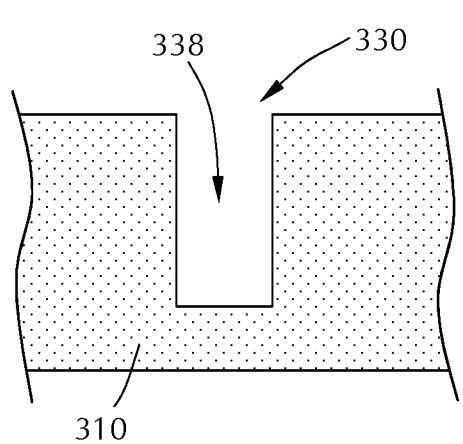
FIGS. 7A through 7F show a gap-fill process in accordance with one or more embodiment of the disclosure.
Figure 7B:
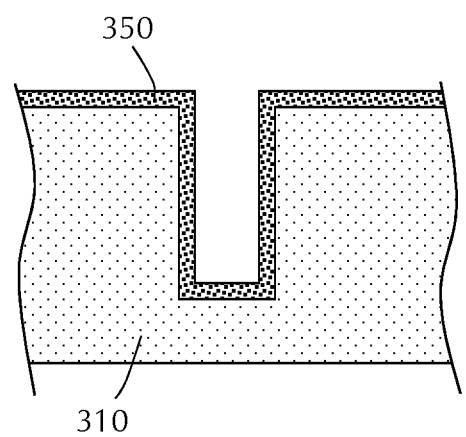
Figure 7C:
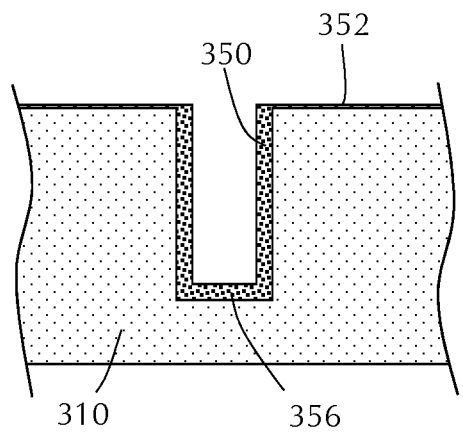

In some embodiments, the reactant causes etching of the top surface of the film being formed. Referring to FIGS. 7A through 7F, a gap-fill process is illustrated using a deposition/etch system. In FIG. 7A, the substrate 310 having a feature 330 thereon is positioned in the processing chamber. The feature 330 has sidewalls that form a gap 338 between. In FIG. 7B, the substrate 310 has been exposed to a precursor (e.g., a silicon precursor) to deposit a film 350 on the substrate. The film 350 has a relatively high conformality at this point. In FIG. 7C, the film 350 has been exposed to an etch reactant which selectively etches the top 352 of the film 350 (also referred to as the top of the feature) so that the film 350 is thicker at the bottom of the trench than at the top. The substrate 310 can be exposed to the degas environment before, during or after the etch reactant. In some embodiments, the substrate is exposed to the etch process as the same time as the degas environment.

Figure 7D:
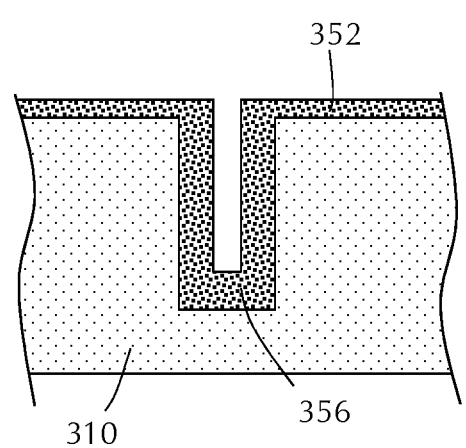
Figure 7E:
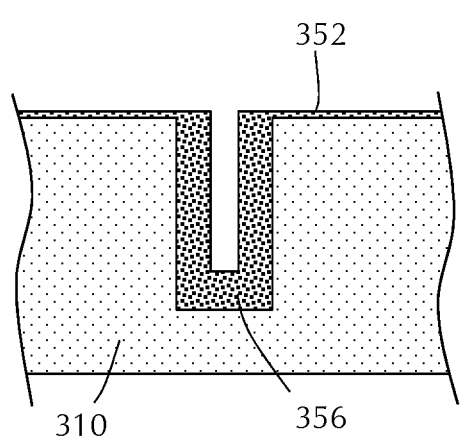
Figure 7F:
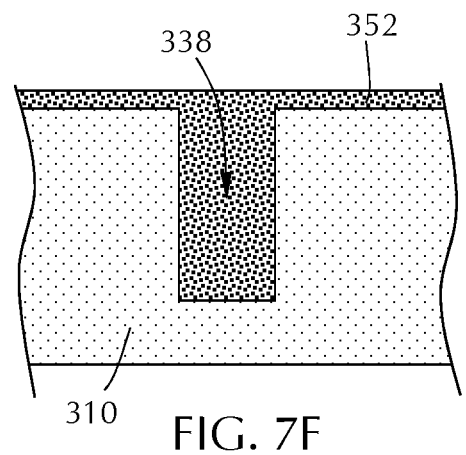

In FIG. 7D, the substrate 310 is exposed to the precursor again to continue to grow the film 350. The thickness of the film at the bottom of the 356 of the feature 330 is greater than at the top 352 and the size of the gap 338 has decreased. FIGS. 7E and 7F show a repeat of the etching and deposition conditions so that the gap 338 is filled with the film 350.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge the excess reagent out of the chamber before flowing in additional regent. Therefore, any leftover reagent in the chamber may react. With spatial separation, excess reagent does not need to be purged, and cross-contamination is limited. Furthermore, a lot of time can be required to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of depositing an amorphous silicon film on a substrate, the method comprising:
   in a processing chamber, repeatedly and sequentially exposing the substrate to precursor exposure regions and degas regions separated by a gas curtain using a non-plasma process to form a continuous amorphous silicon film having predetermined total thickness on a feature on a substrate surface by exposing the substrate surface to a silicon precursor at a target pressure greater than or equal to about 20 Torr in a first precursor exposure region of the processing chamber, the amorphous silicon film having outgassable species comprising hydrogen and a thickness in a range of about 5Å to about 20Å;
   moving the substrate to a first degas region of the processing chamber and exposing the amorphous silicon film to an inert degas environment to form a degassed amorphous silicon film; and
   sequentially moving the substrate to further precursor exposure regions and degas regions to form a degassed amorphous silicon film having a thickness in a range of about 100 Å to about 1 μm, wherein the target pressure is pre-stabilized and not ramped before the substrate is moved to the precursor exposure regions.

2. The method of claim 1, wherein the silicon precursor comprises a poly-silane.

3. The method of claim 2, wherein the poly-silane comprises one or more of disilane, trisilane, tetrasilane, isotetrasilane, neopentasilane, cyclopentasilane, hexasilane or cyclohexasilane.

4. The method of claim 2, wherein the silicon precursor comprises substantially only disilane.

5. The method of claim 1, wherein the inert degas environment consists essentially of an inert gas.

6. The method of claim 5, wherein the inert gas comprises one or more of argon, helium or nitrogen.

7. The method of claim 1, further comprising exposing the substrate surface to a reactant between exposure to the silicon precursor and the inert degas environment, the reactant modifying a property of the amorphous silicon film.

8. The method of claim 1, wherein exposure to the inert degas environment occurs at a pressure in a range of about 50 mTorr to about 200 Torr.

9. The method of claim 1, wherein exposure to each of the silicon precursor and the inert degas environment occurs at a temperature in the range of about 350° C. to about 700° C.

10. The method of claim 1, wherein the degassed amorphous silicon film deposited has conformality greater than or equal to about 80%.

11. The method of claim 1, further comprising etching degassed amorphous silicon film from a top of a feature formed in the substrate surface.

12. The processing method of claim 1, further comprising exposing the substrate surface to a poisoning agent to inhibit growth of the amorphous silicon film at a top of a feature in the substrate surface.

13. A method of depositing an amorphous silicon film on a substrate, the method comprising:
  positioning a substrate having a substrate surface in a processing chamber, the substrate surface having at least one feature thereon, the at least one feature creating a gap with a bottom, top and sidewalls;
  exposing the substrate surface to a non-plasma chemical vapor deposition process at a target pressure greater than or equal to about 20 Torr in a first precursor exposure region of the processing chamber to form continuous amorphous silicon film having an outgassable species comprising hydrogen on the at least one feature, the continuous amorphous silicon film having outgassable species having a thickness in a range of about 5 Å to about 20 Å;
  removing outgassable species from the amorphous silicon film in a first degas region of the processing chamber separated from the first precursor exposure region by a gas curtain by exposing the substrate surface to an inert degas environment to form a degassed amorphous silicon film; and
  sequentially moving the substrate to further precursor exposure regions and degas regions to grow the degassed amorphous silicon film to a predetermined thickness and having a conformality greater than or equal to about 80%, wherein the target pressure is pre-stabilized and not ramped before the substrate is moved to the precursor exposure regions.

14. The processing method of claim 13, further comprising preferentially etching at least some of the degassed amorphous silicon film from the top of the feature between exposures to the non-plasma chemical vapor deposition process.

15. The processing method of claim 13, further comprising poisoning the top of the feature to inhibit growth of the amorphous silicon film during exposure to the non-plasma chemical vapor deposition process.

16. The processing method of claim 15, wherein poisoning the top of the feature comprises exposing the top of the feature to a chlorine-containing species.

* * * * *